(12) United States Patent
White et al.

(10) Patent No.: US 7,781,840 B2
(45) Date of Patent: Aug. 24, 2010

(54) SEMICONDUCTOR DEVICE STRUCTURE

(75) Inventors: Ted R. White, Austin, TX (US);
Alexander L. Barr, Crolles (FR);
Bich-Yen Nguyen, Austin, TX (US);
Marius K. Orlowski, Austin, TX (US);
Mariam G. Sadaka, Austin, TX (US);
Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 11/742,955

(22) Filed: May 1, 2007

(65) Prior Publication Data
US 2007/0235807 A1 Oct. 11, 2007

Related U.S. Application Data

(62) Division of application No. 10/977,423, filed on Oct. 29, 2004, now Pat. No. 7,226,833.

(51) Int. Cl.
*H01L 29/786* (2006.01)

(52) U.S. Cl. .............................. 257/351; 257/E29.273; 438/154

(58) Field of Classification Search ................. 257/351, 257/E29.273; 438/154
See application file for complete search history.

(56) References Cited

U.S. PATENT DOCUMENTS

| 4,874,718 | A | 10/1989 | Inoue |
| 5,212,110 | A | 5/1993 | Pfiester et al. |
| 6,369,438 | B1 | 4/2002 | Sugiyama et al. |
| 6,461,933 | B2 | 10/2002 | Houston |
| 6,830,962 | B1 * | 12/2004 | Guarini et al. ............... 438/149 |
| 7,002,214 | B1 | 2/2006 | Boyd et al. |
| 7,045,432 | B2 | 5/2006 | Orlowski et al. |
| 7,125,785 | B2 * | 10/2006 | Cohen et al. ................. 438/481 |
| 2002/0173114 | A1 | 11/2002 | Fogel et al. |
| 2005/0082531 | A1 * | 4/2005 | Rim ............................ 257/72 |
| 2006/0073646 | A1 * | 4/2006 | Yang .......................... 438/152 |

FOREIGN PATENT DOCUMENTS

WO 0245156 A2 6/2002

OTHER PUBLICATIONS

Wolf et al; "Silicon processing for the VLSI ERA"; vol. 1, 1986, pp. 215-216, 264-265.
Yang et al; "High Performance CMOS Fabricated on Hybrid Substrate with Different Crystal Orientations"; IEEE IEDM Technical Digest, 2003, pp. 18.7.1-18.7.4.
Shima et al; "<100> Channel Strained-SiGe p-MOSFET with Enhanced Hole Mobility and Lower Parasitic resistance,"; IEEE 2002 Symposium on VLSI Technology Digest of Technical Papers, pp. 94-95.

* cited by examiner

*Primary Examiner*—Steven J Fulk
(74) *Attorney, Agent, or Firm*—James L. Clingan, Jr.; David G. Dolezal

(57) ABSTRACT

Two different transistors types are made on different crystal orientations in which both are formed on SOI. A substrate has an underlying semiconductor layer of one of the crystal orientations and an overlying layer of the other crystal orientation. The underlying layer has a portion exposed on which is epitaxially grown an oxygen-doped semiconductor layer that maintains the crystalline structure of the underlying semiconductor layer. A semiconductor layer is then epitaxially grown on the oxygen-doped semiconductor layer. An oxidation step at elevated temperatures causes the oxide-doped region to separate into oxide and semiconductor regions. The oxide region is then used as an insulation layer in an SOI structure and the overlying semiconductor layer that is left is of the same crystal orientation as the underlying semiconductor layer. Transistors of the different types are formed on the different resulting crystal orientations.

6 Claims, 3 Drawing Sheets

SEMICONDUCTOR DEVICE STRUCTURE

FIELD OF THE INVENTION

This invention relates to semiconductor devices, and more particularly, to semiconductor device structures with different crystal orientations for different device types.

RELATED ART

Much study is being devoted to providing improved transistor operation by manipulating the crystal structure of the channel. One of the difficulties in this is separately optimizing the different device types. For example carrier mobility is enhanced for P channel transistors with a channel having a (110) surface crystal orientation under compressive stress in which the channel is formed in the <110> direction, whereas the mobility of N channel transistors is better if the channel has a (100) surface crystal orientation under tensile stress in which the channel is aligned in the (100) direction. Achieving the optimum combination for one transistor type can make it difficult to achieve the optimum combination for the other type. For example epitaxially growing SiGe on silicon can be used to obtain a channel under compressive stress for the P channel transistors but such SiGe layer would be disadvantageous for the N channel transistors. Thus, issues involving integration of the two device types can result in a compromise between the efforts to optimize the P and N channel transistors.

Thus, there is a need for providing a method and device structure for improving the integration in the formation of P and N channel transistors.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, two different transistor types are made on different crystal orientations in which both are formed on SOI. A substrate has an underlying semiconductor layer of one of the crystal orientations and an overlying layer of the other crystal orientation. The underlying layer has a portion exposed on which is epitaxially grown an oxygen-doped semiconductor layer that maintains the crystalline structure of the underlying semiconductor layer. A semiconductor layer is then epitaxially grown on the oxygen-doped semiconductor layer. An oxidation step at elevated temperatures causes the oxide-doped region to separate into oxide and semiconductor regions. The oxide region is then used as an insulation layer in an SOI structure and the overlying semiconductor layer that is left is of the same crystal orientation as the underlying semiconductor layer. Transistors of the different types are formed on the different resulting crystal orientations. This is better understood by reference to the figures and the following description.

Figure 1:
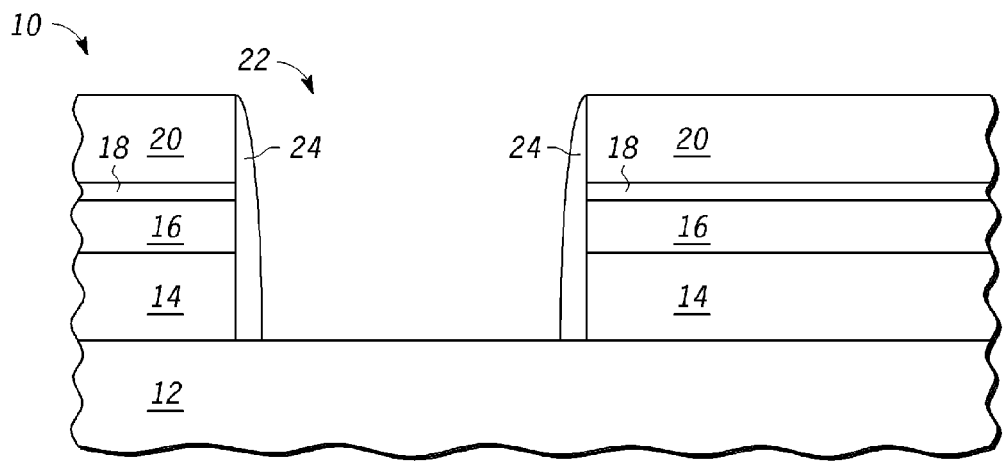
FIG. 1 is a cross section of a semiconductor structure at a first stage in processing useful in the method of an embodiment of the invention.

Shown in FIG. 1 is a semiconductor structure 10 comprising a semiconductor substrate 12, an insulating layer 14, a semiconductor layer 16, an oxide layer 18, a nitride layer 20, a hole 22 through layers 14, 16, 18, and 20, to expose a portion of semiconductor substrate 12 in hole 22, and sidewall spacer 24 inside hole 22. Semiconductor substrate 12 is relatively thick to provide physical support, is preferably silicon, and has a first crystal orientation. Semiconductor substrate 12 could be a different semiconductor material than silicon. Insulating layer 14 is preferably silicon oxide of a thickness between about 1400 and 2000 Angstroms. This thickness is likely to become less as processes continue to improve. Semiconductor layer 16 is preferably silicon having a thickness between about 700 and 1100 Angstroms. This thickness is also expected to become less as processes continue to improve. Oxide layer 18 is preferably about 100 Angstroms and nitride layer 20 is between about 1000 and 1400 Angstroms. Oxide layer 18 and nitride layer 20 together form a hard mask. Other materials and thicknesses may also be useful for such a hard mask. Sidewall spacer 24 is preferably oxide but may also be another material that is useful to provide insulation between the semiconductor material that is to be formed in hole 22 and semiconductor layer 16. One of the first and second crystal orientations is preferably (100) and the other is different, preferably (110).

Figure 2:
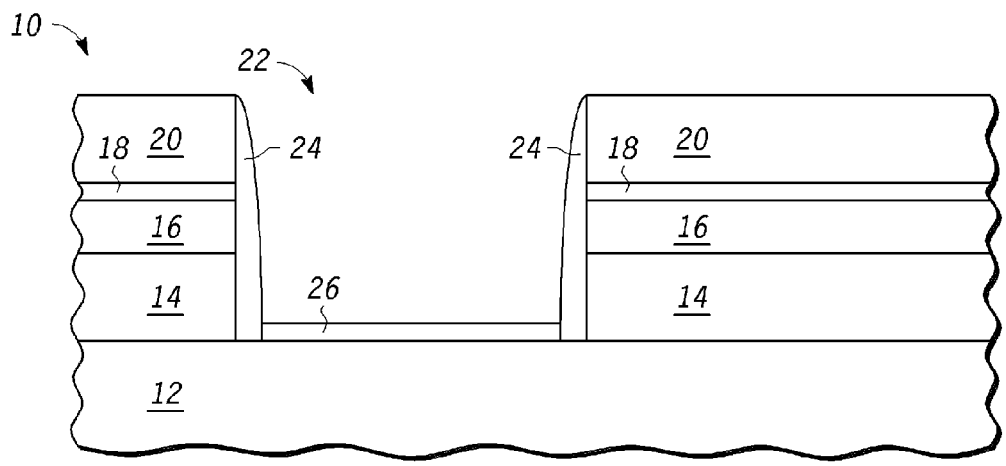
FIG. 2 is a cross section of the semiconductor structure of FIG. 1 at a subsequent stage in processing.

Shown in FIG. 2 is semiconductor structure 10 after epitaxially growing a thin layer 26 of semiconductor material in the first crystal orientation. This thin layer 26 is preferably about 100 Angstroms. Thin layer 26 is preferably silicon but could be a different material such as silicon germanium or silicon carbon to obtain compressive or tensile stress, respectively.

Figure 3:
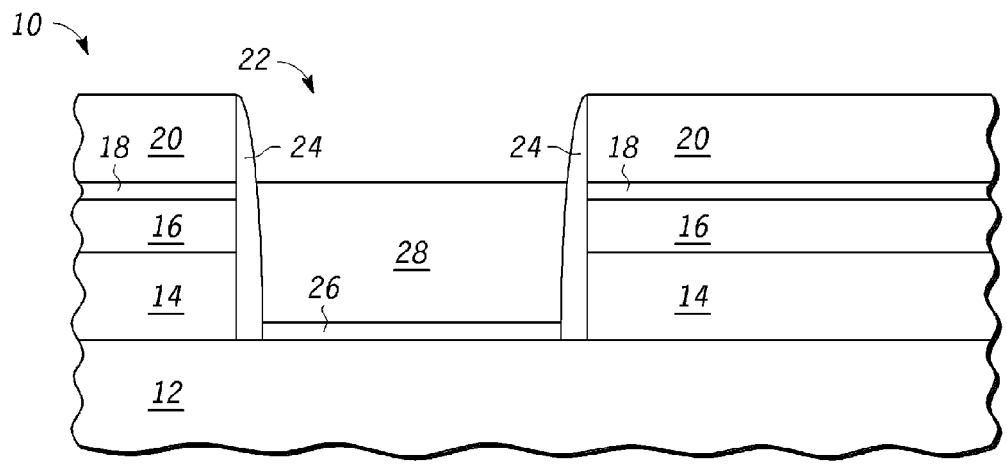
FIG. 3 is a cross section of the semiconductor structure of FIG. 2 at a subsequent stage in processing.

Shown in FIG. 3 is semiconductor structure 10 after epitaxially growing an oxygen-doped semiconductor layer 28. This layer is formed with a relatively low concentration of oxygen, preferably less than 20 atomic percent, in order to maintain the crystal lattice structure of semiconductor substrate 12, and thus the first crystal orientation. For the case where the semiconductor is just silicon, this oxygen-doped semiconductor layer 28 is an oxygen-doped silicon layer that is achieved by a typical silicon epitaxial deposition process with added oxygen in the form of $O_2$ diluted with an inert gas such as helium. The relative amounts of silicon and oxygen flows can be adjusted to achieve the desired atomic percent of oxygen, which should be maintained below 20 atomic percent to keep the growth epitaxial.

Figure 4:
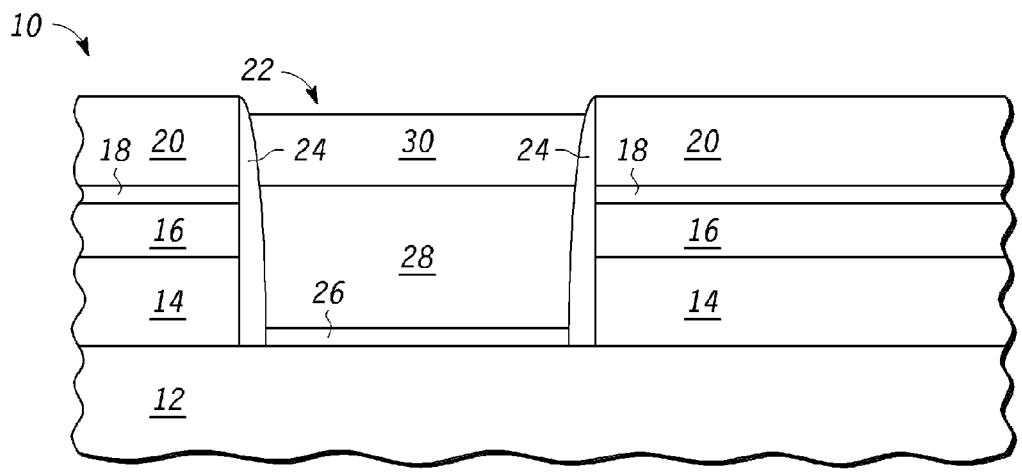
FIG. 4 is a cross section of the semiconductor structure of FIG. 3 at a subsequent stage in processing.

Shown in FIG. 4 is semiconductor structure 10 after epitaxially growing a semiconductor layer 30 on layer 28. In this case semiconductor layer 30 is grown to about 400 Angstroms below the height of nitride layer 20. Semiconductor layer 30 is preferably silicon but could be a different material such as silicon germanium or silicon carbon.

Figure 5:
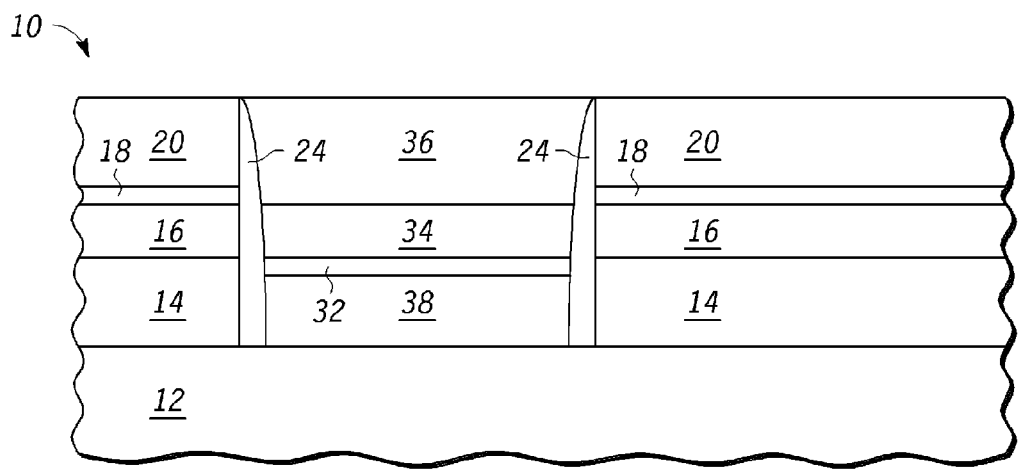
FIG. 5 is a cross section of a semiconductor structure of FIG. 4 at a subsequent stage in processing 4.

Shown in FIG. 5 is semiconductor structure 10 after an oxidation and anneal step. An oxidizing material is flowed at a high temperature to form an oxide layer 36 grown from semiconductor layer 30, a semiconductor layer 34 under oxide layer 36, an oxide layer 32 under semiconductor layer 34, and a semiconductor layer 38 under oxide layer 32. The oxidation causes the formation of oxide layer 32 from the oxygen-doped semiconductor layer 28. The oxygen present in oxygen-doped semiconductor 28, under the heat of oxidation, moves from the crystalline structure to form amorphous silicon oxide as oxide layer 32. This oxide layer 32 forms in the middle of oxygen-doped semiconductor layer 28 and leaves behind crystalline structure of just semiconductor material. The oxygen in the oxygen-doped semiconductor layer 28 coalesces with the silicon in the middle of the oxygen-doped semiconductor layer to form oxide layer 32. The annealing occurs above 1000 degrees Celsius for more than 15 minutes.

The desired result is that the interface between the oxide layer 32 and semiconductor layer 34 be about even with the interface between semiconductor layer 16 and insulating layer 16. This can be achieved because the thickness of oxide layer 34 is a predictable function of the oxygen concentration and thickness of oxygen doped layer 28. Thus, these parameters of oxygen-doped semiconductor layer 28 are chosen to take into account the desired height of the top surface of oxide layer 32. Similarly, oxide growth is performed to obtain the desired thickness of semiconductor layer 34, which is the same height as the height of semiconductor layer 16. There may be situations in which the thickness of semiconductor layers 34 and 16 may be desirably a little different. In such case the oxygen concentration and thickness of oxygen-doped semiconductor layer can be adjusted accordingly.

The formation of oxide layer 36 may be achieved in several known ways. One is by applying steam or hydrogen, which has the added effect of introducing more vacancies in the crystal lattice of semiconductor layer 30 and oxygen-doped semiconductor layer 28 to increase the rate at which oxide layer 32 is formed. Another way to form oxide layer 36 is by oxygen and HCl.

Also, instead of forming oxide layer 36, silicon layer 30 may be left in tact. This would almost certainly require one or more CMP steps in order to bring the top surface of layer 30 down to the height of semiconductor layer 16.

A further enhancement is to implant oxygen into the oxygen-doped semiconductor layer 28. This has the effect of creating more vacancies to increase the rate at which oxide layer 32 is formed while also increasing the oxygen concentration to increase the thickness of oxide layer 32.

Figure 6:
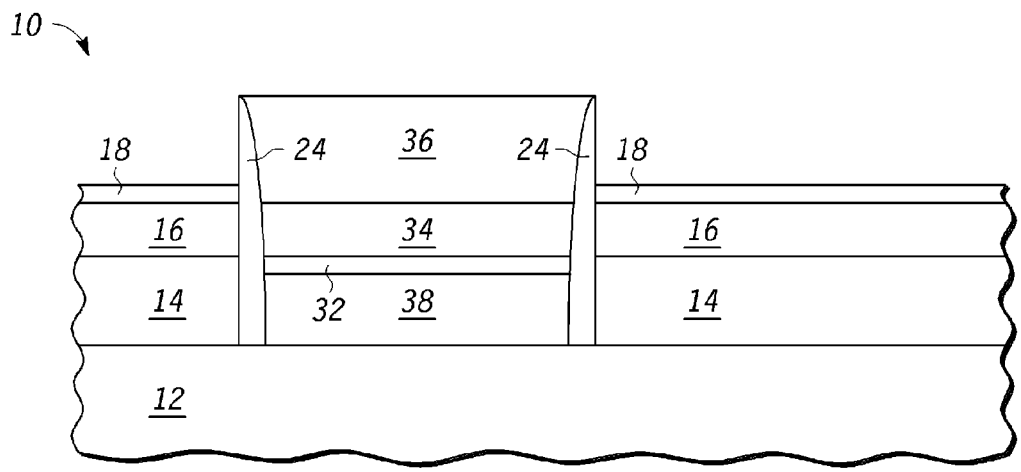
FIG. 6 is a cross section of the semiconductor structure of FIG. 5 at a subsequent stage in processing.

Shown in FIG. 6 is semiconductor structure 10 after removal of nitride layer 20. This can by achieved by a conventional nitride etch that is selective to oxide.

Figure 7:
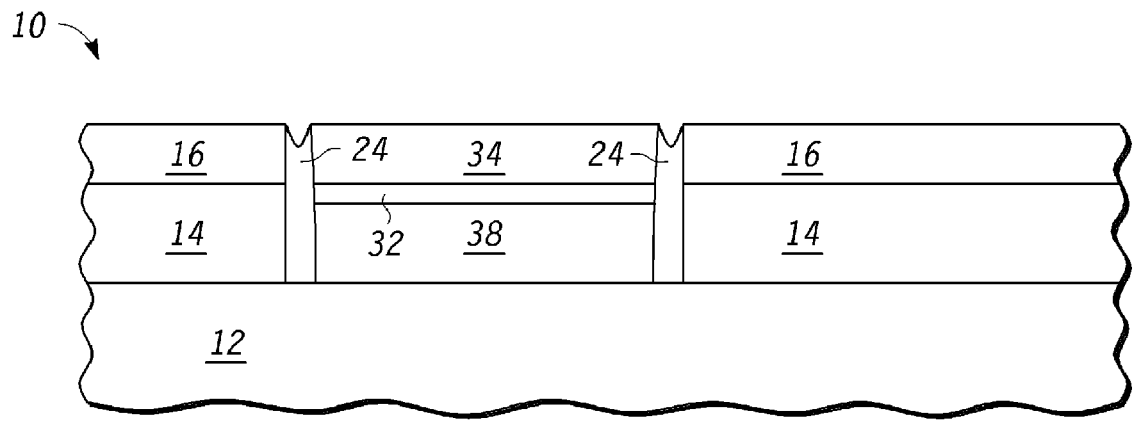
FIG. 7 is a cross section of the semiconductor structure of FIG. 6 at a subsequent stage in processing.
Figure 8:
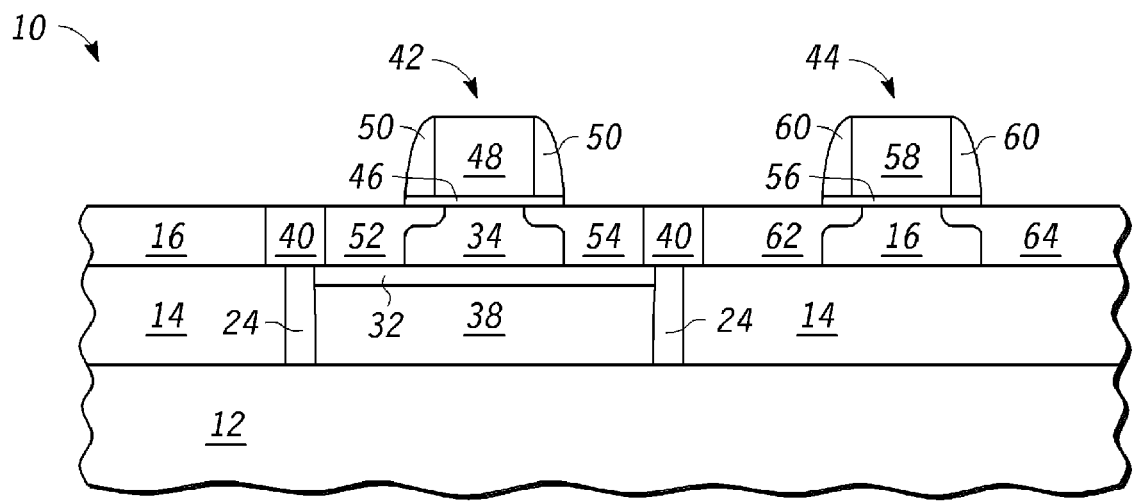
FIG. 8 is a cross section of a semiconductor structure according to a third embodiment of the invention at a stage in processing.

Shown in FIG. 7 is semiconductor structure 10 after an oxide etch that removes oxide layers 18 and 36 as well as removing a portion of sidewall spacer 24. Sidewall spacer 24 is made of a dielectric material such as oxide or nitride Shown in FIG. 8 is semiconductor structure 10 after forming a transistor 42 on semiconductor layer 34 and a transistor 44 on semiconductor layer 16. These transistors may be formed by a conventional means. Over sidewall spacer 24 is formed a trench isolation region 40 that is wider than sidewall spacer 24, for example about 3000 Angstroms. Transistor 42 comprises gate dielectric 46 on semiconductor layer 34, a gate 48 on gate dielectric 46, a sidewall spacer 50 around gate 48, a source/drain 52 in semiconductor layer 34 substantially adjacent to gate 48 on one side, a source drain 54 in semiconductor layer 34 substantially adjacent to gate 48 on another side, and a channel between source/drains 52 and 54 in semiconductor layer 34. Transistor 42 has buried oxide layer 32 between semiconductor layer 34 and semiconductor layer 38 providing an SOI structure. Transistor 44 comprises gate dielectric 56 on semiconductor layer 16, a gate 58 on gate dielectric 56, a sidewall spacer 60 around gate 58, a source/drain 62 in semiconductor layer 16 substantially adjacent to gate 58 on one side, a source drain 64 in semiconductor layer 16 substantially adjacent to gate 58 on another side, and a channel between source/drains 62 and 64 in semiconductor layer 16. Transistor 44 has buried oxide layer 14 between semiconductor substrate 12 and semiconductor layer 16 providing an SOI structure. Thus, it can be seen that both transistors 48 and 58 have the benefit of being formed in an SOI structure.

For the case in which transistor 42 is a P channel transistor, the crystal orientation of semiconductor substrate 12, and thus semiconductor layer 34, is (110). In such case transistor 44 is an N channel transistor and semiconductor layer 16 is a the (100) orientation. Preferably the channel, in the channel length direction, of transistor 42 is aligned in the <110> direction and the channel of transistor 44 is aligned in the <100> direction. In this case, layer 34 being compressive can be beneficial to enhance hole mobility for transistor 42. This can be achieved with substrate 12 being silicon and semiconductor layer 34 being grown as silicon germanium. Semiconductor layer 16 can be originated in tensile stress to enhance electron mobility and can be a different composition than that of semiconductor substrate 12.

For the case in which transistor 42 is an N channel transistor, the crystal orientation of semiconductor substrate 12, and thus semiconductor layer 34, is (100). In such case transistor 44 is a P channel transistor and semiconductor layer 16 is a the (110) orientation. Preferably the channel, in the channel length direction, of transistor 42 is aligned in the <100> direction and the channel of transistor 44 is aligned in the <110> direction. In this case, layer 34 being tensile can be beneficial to enhance electron mobility for transistor 42. This can be achieved with substrate 12 being silicon and semiconductor layer 34 being grown as silicon carbon. Semiconductor layer 16 can be originated in compressive stress to enhance hole mobility and can be a different composition than that of semiconductor substrate 12.

In the foregoing specification, the invention has been described with reference to specific embodiments. However, one of ordinary skill in the art appreciates that various modifications and changes can be made without departing from the scope of the present invention as set forth in the claims below. For example, other embodiments not described herein may be implemented. Certain thicknesses and materials were described and these may be varied. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
a first transistor, the first transistor having a channel region in a first semiconductor layer (16) having a first crystal orientation, the first semiconductor layer is located over a first insulator layer (14);
a second transistor (42), the second transistor having a channel region in a second semiconductor layer (34) having a second crystal orientation, the second semiconductor layer is located over a second insulator layer (32), wherein a first crystal orientation is different from that of the second crystal orientation;
a semiconductor structure (12), the first insulator layer located over the semiconductor structure and the second insulator layer located over the semiconductor structure; and
a third semiconductor layer (38) located over the semiconductor structure and under the second insulator layer, wherein a combined thickness of the third semiconductor layer and the second insulator layer is about the same as the first thickness;
wherein:
wherein the first insulator has a first thickness;
the semiconductor structure has the second crystal orientation;
the first semiconductor layer and the first insulator layer have a first interface;
the second semiconductor layer and the second insulator layer have a second interface;
the first interface and the second interface are about even relative to a top surface of the semiconductor structure; and
the first insulator layer is located on the semiconductor structure.

2. The semiconductor device of claim 1 wherein the first crystal orientation characteristic includes a transistor channel direction.

3. The semiconductor device of claim 1 wherein the first crystal orientation characteristic includes a surface crystal orientation.

4. The semiconductor device of claim 1 wherein the semiconductor structure is characterized as a substrate.

5. The semiconductor device of claim 1 wherein the first semiconductor layer has a different material composition than that of the second semiconductor layer.

6. A semiconductor device comprising:
a first transistor, the first transistor having a channel region in a first semiconductor layer having a first crystal orientation, the first semiconductor layer is located over a first insulator layer;
a second transistor, the second transistor having a channel region in a second semiconductor layer having a second crystal orientation different from the first crystal orientation, the second semiconductor layer is located over a second insulator layer;
a semiconductor structure having the second crystal orientation, wherein the first insulator layer is located on the semiconductor structure and the second insulator layer located over the semiconductor structure; and
a third semiconductor layer having the second crystal orientation located over the semiconductor structure and under the second insulator layer, wherein the third semiconductor layer and the second insulator layer are located in an opening of the first insulator layer and the third semiconductor layer is insulated from the second semiconductor layer,
wherein:
the first semiconductor layer and the first insulator layer have a first interface where the first semiconductor layer is on the first insulator layer;
the second semiconductor layer and the second insulator layer have a second interface where the second semiconductor layer is on the second insulator layer; and
the first interface and the second interface are about even with each other relative to a top surface of the semiconductor structure.

\* \* \* \* \*